(12) United States Patent
Huang et al.

(10) Patent No.: US 8,937,387 B2
(45) Date of Patent: Jan. 20, 2015

(54) SEMICONDUCTOR DEVICE WITH CONDUCTIVE VIAS

(71) Applicant: Advanced Semiconductor Engineering, Inc., Kaohsiung (TW)

(72) Inventors: Che-Hau Huang, Kaohsiung (TW); Ying-Te Ou, Kaohsiung (TW)

(73) Assignee: Advanced Semiconductor Engineering, Inc. (TW)

( * ) Notice: Subject to any disclaimer, the term of this patent is extended or adjusted under 35 U.S.C. 154(b) by 113 days.

(21) Appl. No.: 13/671,409

(22) Filed: Nov. 7, 2012

(65) Prior Publication Data

US 2014/0124919 A1   May 8, 2014

(51) Int. Cl.
*H01L 23/48* (2006.01)
*H01L 21/56* (2006.01)

(52) U.S. Cl.
USPC ............ 257/737; 257/E23.021; 257/E21.502; 257/E23.01; 257/738; 257/778; 257/773; 257/774; 257/784; 257/786; 257/668

(58) Field of Classification Search
CPC . H01L 2924/014; H01L 23/481; H01L 24/48; H01L 2924/19041
USPC .......... 257/737, 738, 778, 773, 774, E23.021, 257/E21.502, E23.011, 784, 786, 668; 438/124
See application file for complete search history.

(56) References Cited

U.S. PATENT DOCUMENTS

| | | | |
|---|---|---|---|
| 3,761,782 A | 9/1973 | Youmans | |
| 4,394,712 A | 7/1983 | Anthony | |
| 4,499,655 A | 2/1985 | Anthony | |
| 4,807,021 A | 2/1989 | Okumura | |
| 4,842,699 A | 6/1989 | Hua et al. | |
| 4,897,708 A | 1/1990 | Clements | |
| 4,982,265 A | 1/1991 | Watanabe et al. | |
| 5,166,097 A | 11/1992 | Tanielian | |
| 5,191,405 A | 3/1993 | Tomita et al. | |
| 5,229,647 A | 7/1993 | Gnadinger | |
| 5,239,448 A | 8/1993 | Perkins et al. | |
| 5,308,443 A | 5/1994 | Sugihara | |
| 5,404,044 A | 4/1995 | Booth et al. | |
| 5,615,477 A | 4/1997 | Sweitzer | |
| 5,643,831 A | 7/1997 | Ochiai et al. | |
| 5,998,292 A | 12/1999 | Black et al. | |
| 6,276,599 B1 | 8/2001 | Ogawa | |

(Continued)

FOREIGN PATENT DOCUMENTS

| | | |
|---|---|---|
| JP | 2002246540 A | 8/2002 |
| JP | 2004228135 A | 8/2004 |
| TW | 200612539 A | 4/2006 |

*Primary Examiner* — Alexander Oscar Williams
(74) *Attorney, Agent, or Firm* — Morgan Law Offices, PLC

(57) ABSTRACT

The disclosure concerns a semiconductor device having conductive vias. In an embodiment, the semiconductor device includes a substrate having at least one conductive via formed therein. The conductive via has a first end substantially coplanar with an inactive surface of the substrate. A circuit layer is disposed adjacent to an active surface of the substrate and electrically connected to a second end of the conductive via. A redistribution layer is disposed adjacent to the inactive surface of the substrate, the redistribution layer having a first portion disposed on the first end an electrically connected thereto, and a second portion positioned upward and away from the first portion. A die is disposed adjacent to the inactive surface of the substrate and electrically connected to the second portion of the redistribution layer.

16 Claims, 12 Drawing Sheets

(56) References Cited

U.S. PATENT DOCUMENTS

| | | | |
|---|---|---|---|
| 6,329,631 B1 | 12/2001 | Yueh | |
| 6,406,934 B1 | 6/2002 | Glenn et al. | |
| 6,448,506 B1 | 9/2002 | Glenn et al. | |
| 6,457,633 B1 | 10/2002 | Takashima et al. | |
| 6,577,013 B1 | 6/2003 | Glenn et al. | |
| 6,670,269 B2 | 12/2003 | Mashino | |
| 6,699,787 B2 | 3/2004 | Mashino | |
| 6,740,950 B2 | 5/2004 | Paek | |
| 6,812,549 B2 | 11/2004 | Umetsu et al. | |
| 6,815,348 B2 | 11/2004 | Mashino | |
| 6,962,829 B2 | 11/2005 | Glenn et al. | |
| 7,078,269 B2 | 7/2006 | Yamasaki et al. | |
| 7,134,198 B2 | 11/2006 | Nakatani | |
| 7,157,372 B1 | 1/2007 | Trezza | |
| 7,215,032 B2 | 5/2007 | Trezza | |
| 7,222,420 B2 | 5/2007 | Moriizumi | |
| 7,238,590 B2 | 7/2007 | Yang et al. | |
| 7,262,475 B2 | 8/2007 | Kwon et al. | |
| 7,276,787 B2 | 10/2007 | Edelstein et al. | |
| 7,285,434 B2 | 10/2007 | Yee et al. | |
| 7,298,030 B2 | 11/2007 | McWilliams et al. | |
| 7,334,326 B1 | 2/2008 | Huemoeller et al. | |
| 7,365,436 B2 | 4/2008 | Yamano | |
| 7,371,602 B2 | 5/2008 | Yee | |
| 7,388,293 B2 | 6/2008 | Fukase et al. | |
| 7,415,762 B2 | 8/2008 | Fukase et al. | |
| 7,482,272 B2 | 1/2009 | Trezza | |
| 7,508,057 B2 | 3/2009 | Shiraishi et al. | |
| 7,508,079 B2 | 3/2009 | Higashi | |
| 7,514,797 B2 * | 4/2009 | Chen et al. | 257/777 |
| 7,528,053 B2 | 5/2009 | Huang et al. | |
| 7,538,033 B2 | 5/2009 | Trezza | |
| 7,553,752 B2 | 6/2009 | Kuan et al. | |
| 7,560,744 B2 | 7/2009 | Hsiao et al. | |
| 7,598,163 B2 | 10/2009 | Callahan et al. | |
| 7,605,463 B2 | 10/2009 | Sunohara | |
| 7,625,818 B2 | 12/2009 | Wang | |
| 7,642,132 B2 | 1/2010 | Huang et al. | |
| 7,656,023 B2 | 2/2010 | Sunohara et al. | |
| 7,659,202 B2 | 2/2010 | Trezza | |
| 7,666,711 B2 | 2/2010 | Pagaila et al. | |
| 7,678,685 B2 | 3/2010 | Sunohara et al. | |
| 7,681,779 B2 | 3/2010 | Yang | |
| 7,687,397 B2 | 3/2010 | Trezza | |
| 7,691,747 B2 | 4/2010 | Lin et al. | |
| 7,733,661 B2 | 6/2010 | Kossives et al. | |
| 7,741,148 B1 | 6/2010 | Marimuthu et al. | |
| 7,741,152 B2 | 6/2010 | Huang et al. | |
| 7,741,156 B2 | 6/2010 | Pagaila et al. | |
| 7,772,081 B2 | 8/2010 | Lin et al. | |
| 7,772,118 B2 | 8/2010 | Yamano | |
| 7,786,008 B2 | 8/2010 | Do et al. | |
| 7,786,592 B2 | 8/2010 | Trezza | |
| 7,795,140 B2 | 9/2010 | Taguchi et al. | |
| 7,808,060 B2 | 10/2010 | Hsiao | |
| 7,808,111 B2 | 10/2010 | Trezza | |
| 7,811,858 B2 | 10/2010 | Wang et al. | |
| 7,816,265 B2 | 10/2010 | Wang | |
| 7,838,337 B2 * | 11/2010 | Marimuthu et al. | 438/110 |
| 7,842,597 B2 | 11/2010 | Tsai | |
| 8,237,257 B2 * | 8/2012 | Yang | 257/692 |
| 8,674,513 B2 * | 3/2014 | Yu et al. | 257/774 |
| 2002/0017855 A1 | 2/2002 | Cooper et al. | |
| 2002/0094605 A1 | 7/2002 | Pai et al. | |
| 2004/0124518 A1 | 7/2004 | Karnezos | |
| 2004/0259292 A1 | 12/2004 | Beyne et al. | |
| 2005/0189635 A1 | 9/2005 | Humpston et al. | |
| 2005/0258545 A1 | 11/2005 | Kwon | |
| 2006/0027632 A1 | 2/2006 | Akram | |
| 2006/0197216 A1 | 9/2006 | Yee | |
| 2007/0048896 A1 | 3/2007 | Andry et al. | |
| 2007/0138562 A1 | 6/2007 | Trezza | |
| 2007/0187711 A1 | 8/2007 | Hsiao et al. | |
| 2008/0272486 A1 | 11/2008 | Wang et al. | |
| 2009/0032928 A1 | 2/2009 | Chiang et al. | |
| 2009/0039527 A1 | 2/2009 | Chan et al. | |
| 2009/0140436 A1 | 6/2009 | Wang | |
| 2009/0146297 A1 | 6/2009 | Badakere et al. | |
| 2009/0166785 A1 | 7/2009 | Camacho et al. | |
| 2009/0243045 A1 | 10/2009 | Pagaila et al. | |
| 2009/0294959 A1 | 12/2009 | Chiang et al. | |
| 2009/0302435 A1 | 12/2009 | Pagaila et al. | |
| 2009/0302437 A1 | 12/2009 | Kim et al. | |
| 2009/0309235 A1 | 12/2009 | Suthiwongsunthorn et al. | |
| 2009/0321916 A1 | 12/2009 | Wang et al. | |
| 2010/0006330 A1 * | 1/2010 | Fu et al. | 174/260 |
| 2010/0059855 A1 | 3/2010 | Lin et al. | |
| 2010/0065948 A1 | 3/2010 | Bae et al. | |
| 2010/0133704 A1 | 6/2010 | Marimuthu et al. | |
| 2010/0140737 A1 | 6/2010 | Lin et al. | |
| 2010/0140751 A1 | 6/2010 | Tay et al. | |
| 2010/0140752 A1 | 6/2010 | Marimuthu et al. | |
| 2010/0140776 A1 | 6/2010 | Trezza | |
| 2010/0148316 A1 | 6/2010 | Kim et al. | |
| 2010/0187681 A1 | 7/2010 | Chen et al. | |
| 2010/0197134 A1 | 8/2010 | Trezza | |
| 2010/0230759 A1 | 9/2010 | Yang et al. | |
| 2010/0230760 A1 | 9/2010 | Hung | |
| 2010/0230788 A1 | 9/2010 | Peng | |
| 2010/0244244 A1 | 9/2010 | Yang | |
| 2010/0276690 A1 | 11/2010 | Chen | |
| 2010/0327465 A1 | 12/2010 | Shen et al. | |
| 2011/0048788 A1 | 3/2011 | Wang et al. | |
| 2011/0068437 A1 | 3/2011 | Chiu et al. | |
| 2012/0001306 A1 * | 1/2012 | Wang et al. | 257/666 |
| 2013/0075936 A1 * | 3/2013 | Lin et al. | 257/777 |
| 2013/0105991 A1 * | 5/2013 | Gan et al. | 257/777 |
| 2013/0168850 A1 * | 7/2013 | Samoilov et al. | 257/737 |
| 2013/0195989 A1 * | 8/2013 | Medo et al. | 424/522 |
| 2013/0207260 A1 * | 8/2013 | Hsu et al. | 257/738 |
| 2014/0070422 A1 * | 3/2014 | Hsiao et al. | 257/774 |
| 2014/0091473 A1 * | 4/2014 | Len et al. | 257/774 |

* cited by examiner

SEMICONDUCTOR DEVICE WITH CONDUCTIVE VIAS

BACKGROUND OF THE INVENTION

1. Field of the Invention

The present invention relates to the field of semiconductor packaging, and, more particularly, to a 3-D semiconductor device and semiconductor process for manufacturing the same.

2. Description of the Related Art

In stacked-chip packaging, multiple integrated circuit chips can be packaged in a single package structure in a vertically stacked manner. This increases stack density, making the package structure smaller, and often reduces the length of the path that signals must traverse between chips. Thus, stacked-chip packaging tends to increase the speed of signal transmission between or among chips. Additionally, stacked-chip packaging allows chips having different functions to be integrated in a single package structure. Use of through silicon vias (TSV) has been a key technology in realizing stacked-chip packaging integration due to the ability to provide short vertical conductive paths between chips.

SUMMARY OF THE INVENTION

One aspect of the disclosure relates to a semiconductor device. In one embodiment the semiconductor device comprises a substrate; a conductive via formed in the substrate, the conductive via having a first end substantially coplanar with an inactive surface of the substrate; a circuit layer, disposed adjacent to an active surface of the substrate and electrically connected to a second end of the conductive via; a redistribution layer disposed adjacent to the inactive surface of the substrate, the redistribution layer having a first portion disposed on the first end and electrically connected thereto, and a second portion positioned upward and away from the first portion; and a die, disposed adjacent to the inactive surface of the substrate and electrically connected to the second portion of the redistribution layer. The semiconductor device can further include a dielectric layer disposed between the inactive surface of the substrate and the second portion of the redistribution layer, and a protection layer covering the redistribution layer and the dielectric layer, the protection layer having openings to expose portions of the redistribution layer. which facilitate the electrical connection between the die and the redistribution layer. Additionally, the semiconductor device can include a plurality of under bump metallurgies (UBMs), disposed adjacent to the active surface of the substrate and electrically connected to the circuit layer. The circuit layer and the die can each include one or more integrated passive device (IPD). The conductive via can include a conductive via that comprises a seed layer comprising an annular portion disposed vertically and a base portion contiguous with the annular portion and adjacent and substantially parallel to the active surface and a second metal layer disposed on interior surfaces of the seed layer. In other embodiments, the conductive via can be a solid pillar.

In another embodiment, the conductive via formed in the substrate of the substrate can protrude from the inactive surface of the substrate. In this case, the redistribution layer can be disposed on all surfaces (including the side surfaces) of the protruding tip of the conductive via, to provide enhanced electrical contact and a more secure attachment.

Another aspect of the disclosure relates to manufacturing a semiconductor device. In one embodiment, a method of making a semiconductor device comprises (a) providing a wafer having a substrate and a circuit layer, wherein the substrate has an active surface and a inactive surface, and the circuit layer is disposed adjacent to the active surface; (b) forming a plurality of under bump metallurgies (UBMs) on the circuit layer; (c) attaching a carrier to the wafer, wherein the under bump metallurgies (UBMs) face the carrier; (d) forming a redistribution layer on the inactive surface; (e) attaching a die adjacent to the inactive surface, wherein the die is electrically connected to the redistribution layer; and (f) forming a molding compound adjacent to the inactive surface to encapsulate the die. In step (a), the circuit layer can comprise a plurality of first pads, a plurality of second pads, a first protection layer and a first dielectric layer; the first dielectric layer is disposed on the active surface of the substrate; the first pads and the second pads are disposed on the first dielectric layer; the first protection layer covers the first pads and has a plurality of openings to expose the second pads. In step (b), the under bump metallurgies (UBMs) can be formed in the openings of the first protection layer to contact the second pads. After step (c), the semiconductor process can comprise the steps of: (c1) forming a plurality of interconnection metals in the substrate to electrically connect the circuit layer; and (c2) is forming a redistribution layer adjacent to the inactive surface, wherein the redistribution layer is electrically connected to the interconnection metals. Additionally, step (c1) can comprise the steps of (c11) forming a plurality of cylindrical cavities from the inactive surface of the substrate, wherein the cylindrical cavities expose a part of the circuit layer; (c12) forming the interconnection metals in the cylindrical cavities; (c13) forming a plurality of circular grooves from the inactive surface of the substrate, wherein each of the circular grooves surrounds each of the interconnection metals; and (c14) forming an insulation circular layer in each of the circular grooves.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION OF THE INVENTION

Figure 1:
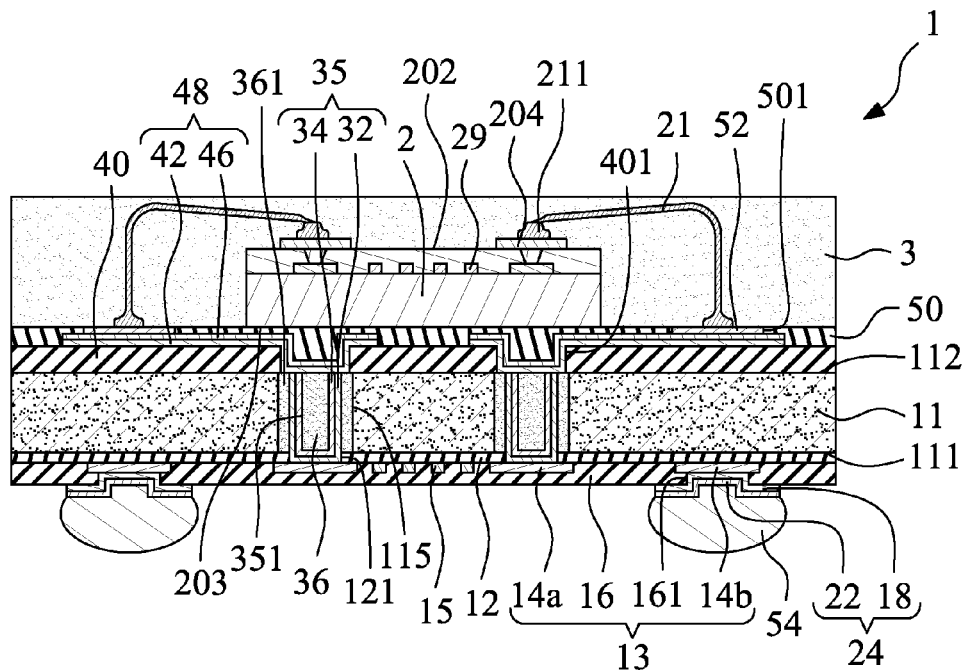
FIG. 1 illustrates a cross-sectional view of a semiconductor device according to an embodiment of the present invention.

Referring to FIG. 1, a cross-sectional view of a semiconductor device 1, according to an embodiment of the present invention, is illustrated. The semiconductor device 1 comprises a substrate 11, a first dielectric layer 12, a circuit layer 13, a plurality of under bump metallurgies (UBMs) 24, a plurality of interconnection metals 35, a central insulation material 36, an insulation circular layer 361, a second dielectric layer 40, a redistribution layer 48, a second protection layer 50, a die 2, a plurality of bonding wires 21, a plurality of solder balls 54 and a molding compound 3.

The substrate 11 has an active surface 111, an inactive surface 112 and a plurality of through holes 115. In this embodiment, the material of the substrate 11 is a semiconductor material such as silicon or germanium. However, in other embodiments, the material of the substrate 11 may be glass.

The first dielectric layer 12 is disposed on the active surface 111 of the substrate 11. In this embodiment, the material of the first dielectric layer 12 is silicon oxide or silicon nitride. However, in other embodiments, the first dielectric layer 12 may include a polymer, such as polyimide (PI) or polypropylene (PP).

The circuit layer 13 is disposed adjacent to the active surface 111 of the substrate 11. In this embodiment, the circuit layer 13 is disposed on the first dielectric layer 12, and includes a plurality of first pads 14a, a plurality of second pads 14b and a first protection layer 16. The first pads 14a, the second pads 14b and the first protection layer 16 are disposed on the first dielectric layer 12. The first pads 14 and the second pads 14b are parts of one of the metal layers (not shown) of the circuit layer 13. In this embodiment, the material of the metal layers is copper. The first protection layer 16 covers the first pads 14 and has a plurality of openings 161 to expose the second pads 14b. In this embodiment, the first protection layer 16 includes a polymer such as polyimide (PI) or polypropylene (PP). However, in other embodiments, the material of the first protection layer 16 can be silicon oxide or silicon nitride.

In this embodiment, the circuit layer 13 further includes at least one first integrated passive device (IPD) 15 disposed on the first dielectric layer 12 and covered by the first protection layer 16. Therefore, the first integrated passive device (IPD) 15 is adjacent to the active surface 111 of the substrate 11. In this embodiment, the first integrated passive device (IPD) 15 is an inducer. However, the first integrated passive device (IPD) 15 may be include a capacitor, a resistor, or a combination of a inducer, a capacitor and a resistor.

Each of the under bump metallurgies (UBM) 24 is disposed in each of the openings 161 of the first protection layer 16 to contact the second pads 14b, so that the under bump metallurgies (UBMs) 24 are electrically connected to the circuit layer 13. In this embodiment, the under bump metallurgy (UBM) 24 comprises a first metal layer 22 and a first seed layer 18. The first metal layer 22 is a single layer or multi-layer structure. The material of the first seed layer 18 is tantalum nitride, and the material of the first metal layer 22 is a mixture of nickel (Ni), palladium (Pd), and gold (Au); nickel (Ni) and gold (Au); or nickel (Ni) and palladium (Pd). However, the first seed layer 18 may be omitted. The solder balls 54 are disposed on the under bump metallurgies (UBM) 24.

Each of the interconnection metals 35 is disposed in each of the respective through holes 115 of the substrate 11, and electrically connects the circuit layer 13 and the redistribution layer 48. In the present embodiment, the interconnection metal 35 further extends through the first dielectric layer 12 to contact the first pad 14a. The interconnection metal 35 has a second metal layer 34 and a second seed layer 32 surrounding the second metal layer 34, and the base of the second seed layer 32 contacts the first pad 14a. The second seed layer 32 comprises an annular portion disposed vertically (with respect to the through holes 115) and the base of the second seed layer 32 is contiguous with the annular portion and adjacent and substantially parallel to the active surface 111. In the present embodiment, the central insulation material 36 is disposed in the interior portion 351. It is to be understood that the interconnection metal 35 may be a solid pillar instead, and the central insulation material 36 would then be omitted. The material of the second seed layer 32 is tantalum nitride or tantalum tungsten, and the material of the second metal layer 34 is copper. However, the second seed layer 32 may be omitted.

In this embodiment, the insulation circular layer 361 is disposed in the through hole 115 and surrounds the interconnection metal 35. As shown in FIG. 1, the insulation circular layer 361 has a bottom surface and the bottom surface contacts the first dielectric layer 12; that is, the insulation circular layer 361 does not extend into the first dielectric layer 12 and the interconnection metal 35 extends partly to the circuit layer 13. Therefore, the bottom surface of the interconnection metal 35 is not coplanar with the bottom surface of the insulation circular layer 361, and the length of the interconnection metal 35 is greater than that of the insulation circular layer 361. The material of the central insulation material 36 can be a polymer, which is the same as the insulation circular layer 361.

The second dielectric layer 40 is disposed on the inactive surface 112 of the substrate 11, and has a plurality of openings 401 to expose the interconnection metals 35. In this embodiment, the second dielectric layer 40 includes a polymer such as polyimide (PI) or polypropylene (PP). However, in other embodiments, the material of the second dielectric layer 40 can be silicon oxide or silicon nitride.

The redistribution layer 48 is disposed adjacent to the inactive surface 112 of the substrate 11. In this embodiment, the redistribution layer 48 is disposed on the second dielectric layer 40 and in the openings 401 of the second dielectric layer 40 to contact the interconnection metals 35. In this embodiment, the redistribution layer 48 comprises a third seed layer 42 and a third metal layer 46. The material of the third seed layer 42 is tantalum nitride or tantalum tungsten, and the material of the third metal layer 46 is copper. However, the third seed layer 42 may be omitted.

The second protection layer 50 covers the redistribution layer 48 and the second dielectric layer 40, and has a plurality of openings 501 to expose a part of the redistribution layer 48. In this embodiment, a surface finish layer 52 is plated on the exposed part of the redistribution layer 48.

The die 2 is disposed adjacent to the inactive surface 112 of the substrate 11 and electrically connected to the redistribution layer 48. In this embodiment, the die 2 has an active surface 202, an inactive surface 203, a plurality of pads 204 and at least one second integrated passive device (IPD) 29. The pads 204 and the second integrated passive device (IPD) 29 are disposed adjacent to the active surface 202 of the die 2. In this embodiment, the second integrated passive device (IPD) 29 is an inducer. However, the second integrated passive device (IPD) 29 may be a capacitor, a resistor, or a combination of a inducer, a capacitor and a resistor. In this embodiment, the first integrated passive device (IPD) 15 is disposed adjacent to the active surface 111 of the substrate 11 and the second integrated passive device (IPD) 29 is disposed adjacent to the active surface 202 of the die 2. The interference of magnetic field between first IPD 15 and second IPD 29 is inversely proportional to the distance. Therefore, if the die 2 is disposed adjacent to the inactive surface 112 of the substrate 11, it will have a larger distance than the die which is disposed on the active surface 111 of the substrate 11.

Based on the following formula:

$$Q = \frac{1}{R}\sqrt{\frac{L}{C}}$$

The frequency Q-factor is related to the inductance (L), and is proportional to the inductance (L) if the resistance (R) and capacitance (C) are constant. For this reason, this embodiment with enhanced inductances has an enhanced frequency Q-factor.

The inactive surface 203 of the die 2 is adhered on the second protection layer 50. The pads 204 are electrically connected to the surface finish layer 52 on the exposed part of the redistribution layer 48 through the bonding wires 21. That is, the bonding wires 21 connect the die 2 and the redistribution layer 48. In this embodiment, the bonding type of the bonding wires 21 is a reverse bond. The first step of the reverse bond is forming a first wire ball 211 on the pad 204 of the die 2. Then, the tip of the wire 21 is formed another wire ball and is bonded on the surface finish 52. Finally, the wire 21 is cut off after it is drawn to contact the first wire ball 211.

The molding compound 3 is disposed adjacent to the inactive surface 112 of the substrate 11, and encapsulates the die 2 and the bonding wires 21. In this embodiment, the molding compound 3 is disposed on the second protection layer 50.

Figure 2A:
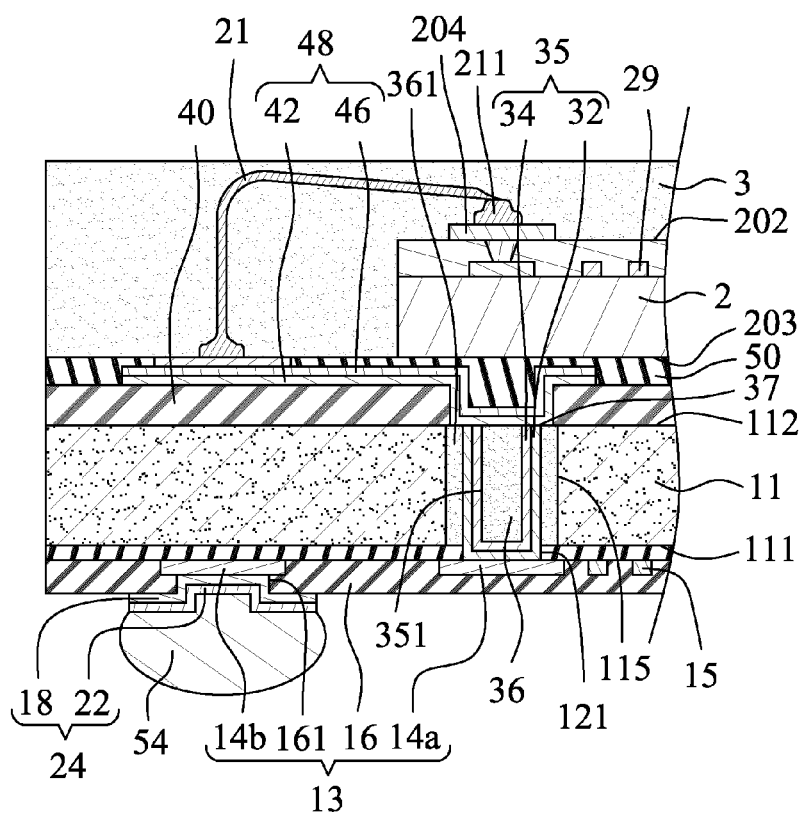
FIG. 2(a) illustrates a partially enlarged cross-sectional view of the semiconductor device of FIG. 1.

Referring to FIG. 2(a), a partially enlarged cross-sectional view of the semiconductor device 1 is illustrated. As shown, the conductive via (comprising the interconnection metals 35, central insulation material 36, and insulation circular layer 361 which are disposed in the through hole 115) has a first end 37 substantially coplanar with the inactive surface 112 of the substrate 11. Additionally, the insulation circular layer 361 isolates the conductive via from the substrate 11. The insulation circular layers 361 are hollow cylinders formed in the substrate 11. The second seed layer 32 is disposed on inboard sidewalls of the insulation circular layer 361. The second metal layer 34 is disposed on inboard sidewalls of the second seed layer 32. The second seed layer 32 and the second metal layer 34 are also hollow cylinders similar to the insulation circular layer 361. Within the second metal layer 34, the central insulation material 36 is disposed. Thus, the conductive via is comprised of the outer insulation circular layer 361, the second seed layer 32, the second metal layer 34 and the central insulation material 36 formed in a concentric, annular design.

In this embodiment, the die 2 is disposed adjacent to and electrically connected to the inactive surface 112 of the substrate 11, and signals from the die 2 are transmitted to the circuit layer 13 on the active surface 111 of the substrate 11 through the interconnection metals 35. That is, the bonding wires 21 are also disposed adjacent to the inactive surface 112 of the substrate 11, thereby preventing the circuit layer 13 on the active surface 111 of the substrate 11 from being damaged during the wire bonding process and the die attaching process. In addition, as is well known, bonding wire is pressed to a bonding pad and ultrasonic friction therebetween is applied to finish the wire bonding process. The thickness of the second pads 14b is about 0.3 um~1 um and the thickness of the redistribution layer 48 is about 2 um~5 um. However, the thickness of the second pads 14b is less than that of the redistribution layer 48 or the surface finish layer 52. Thus, if the wire bonding process is performed on the second pads 14b of the active surface 111 of the substrate 11, the second pads 14b are easily damaged.

In this embodiment, the second integrated passive device (IPD) 29 are disposed adjacent to the active surface 202 of the die 2, and the first integrated passive device (IPD) 15 is adjacent to the active surface 111 of the substrate 11. Further, the inactive surface 203 of the die 2 is adhered on the second protection layer 50, and is adjacent to the inactive surface 112 of the substrate 11. Thus, the inactive surface 203 of the die 2 and the inactive surface 112 of the substrate 11 are disposed between the active surface 202 of the die 2 and the active surface 111 of the substrate 11. Therefore, the distance between the second integrated passive device (IPD) 29 and the first integrated passive device (IPD) 15 is relatively large, which results in high frequency Q-factor.

Figure 2B:
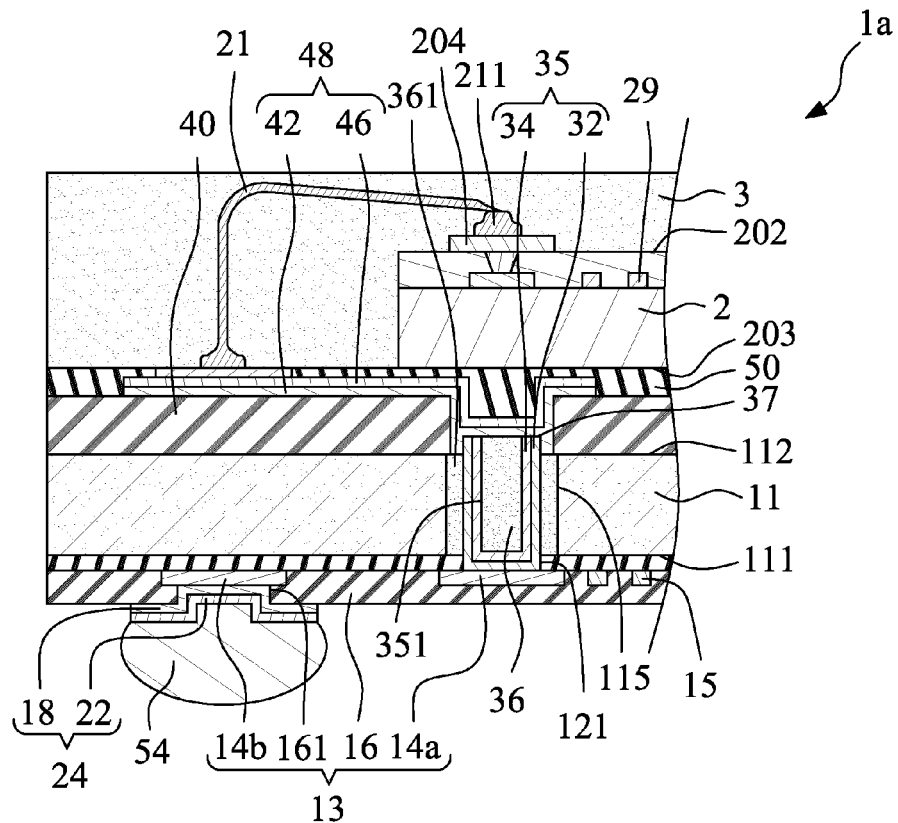
FIG. 2(b) illustrates a partially enlarged cross-sectional view of a semiconductor device according to another embodiment of the present invention.

Referring to FIG. 2(b), a partially enlarged cross-sectional view of a semiconductor device 1a, according to another embodiment of the present invention, is illustrated. The semiconductor device 1a of this embodiment is substantially similar to the semiconductor device 1 of FIG. 1, and the same elements are designated with the same reference numerals. The difference between the semiconductor device 1a of this embodiment and the semiconductor device 1 of FIG. 1 is that the first end 37 protrudes from the inactive surface 112 of the substrate 11. In this case, the insulation circular layer 361 is substantially coplanar with the inactive surface 112 but the interconnection metals 35 and central insulation material 36 protrude from the inactive surface 112. In this embodiment, the redistribution layer 48 is disposed on lateral and end surfaces of the first end 37 of the conductive via, as shown, to provide enhanced electrical contact with the interconnection metals 35 and provide more secure attachment with the first end 37.

Figure 3:
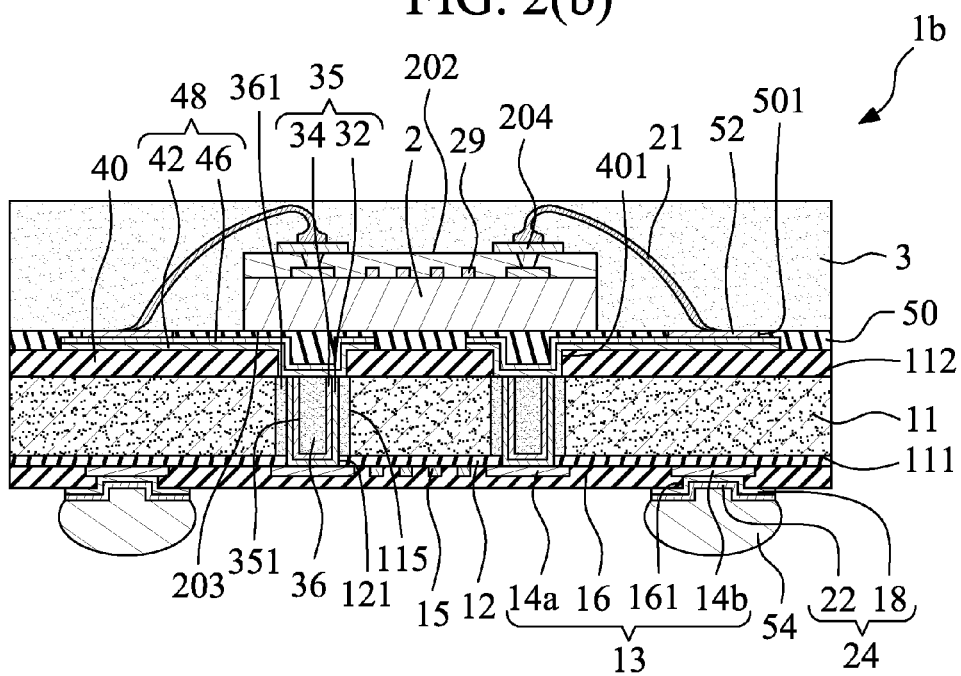
FIG. 3 illustrates a cross-sectional view of a semiconductor device according to another embodiment of the present invention.

Referring to FIG. 3, a cross-sectional view of a semiconductor device according to another embodiment of the present invention is illustrated. The semiconductor device 1b of this embodiment is substantially similar to the semiconductor device 1 of FIG. 1, and the same elements are designated with the same reference numerals. The difference between the semiconductor device 1b of this embodiment and the semiconductor device 1 of FIG. 1 is described as follows. In this embodiment, the bonding type of the bonding wires 21 is a forward bond. The first step of the forward bond is bonding the wire 21 to the pad 204 of the die 2. Then, the wire 21 is cut off after it is drawn to contact the surface finish 52.

Referring to FIGS. 4 to 19, a semiconductor process for manufacturing a semiconductor device according to an embodiment of the present invention is illustrated.

Figure 4:
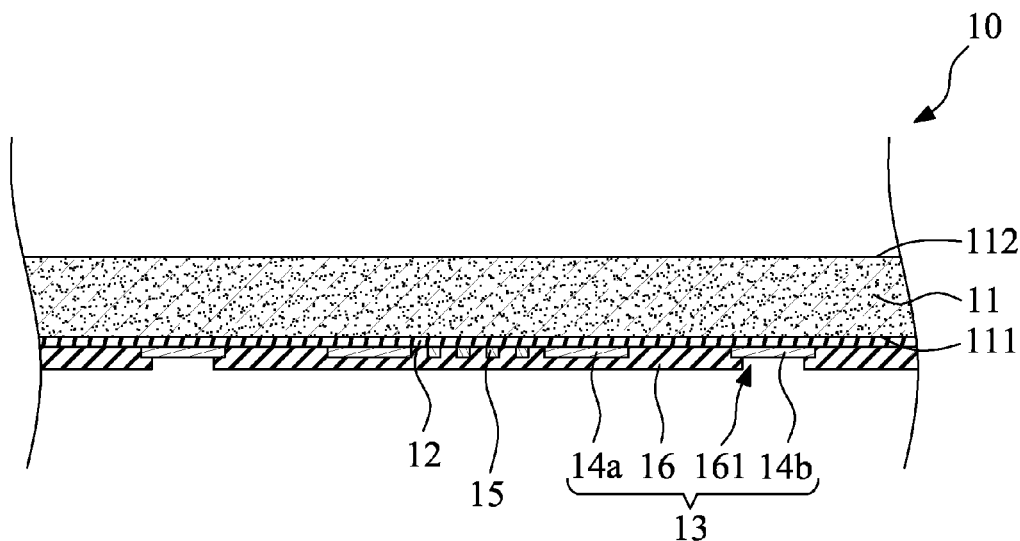
FIGS. 4 to 19 illustrate a semiconductor process for manufacturing a semiconductor device according to an embodiment of the present invention.

Referring to FIG. 4, a wafer 10 is provided. The wafer 10 has a substrate 11, a first dielectric layer 12 and a circuit layer 13. In general, the first dielectric layer 12 and the circuit layer 13 would already be disposed on the substrate 11 after the foundry's process. The substrate 11 has an active surface 111 and a inactive surface 112. In this embodiment, the material of the substrate 11 is a semiconductor material such as silicon or germanium. However, in other embodiments, the material of the substrate 11 may be glass. The first dielectric layer 12 is disposed on the active surface 111 of the substrate 11. In this embodiment, the material of the first dielectric layer 12 is silicon oxide or silicon nitride. However, in other embodiments, the first dielectric layer 12 may include a polymer, such as polyimide (PI) or polypropylene (PP).

The circuit layer 13 is disposed adjacent to the active surface 111 of the substrate 11. In this embodiment, the circuit layer 13 is disposed on the first dielectric layer 12, and includes a plurality of first pads 14a, a plurality of second pads 14b and a first protection layer 16. The first pads 14a and the second pads 14b are parts of one of the metal layers (not shown) of the circuit layer 13. In this embodiment, the material of the metal layers is copper. The first protection layer 16 covers the first pads 14a and has a plurality of openings 161 to expose the second pads 14b. In this embodiment, the first protection layer 16 includes a polymer such as polyimide (PI) or polypropylene (PP). However, in other embodiments, the material of the first protection layer 16 can be silicon oxide or silicon nitride. It is to be noted that if only the substrate 11 is provided at this initial step, then the process further comprises the steps of forming the first dielectric layer 12 and the circuit layer 13.

In this embodiment, the circuit layer 13 further includes at least one first integrated passive device (IPD) 15 disposed on the first dielectric layer 12 and covered by the first protection layer 16. Therefore, the first integrated passive device (IPD) 15 is adjacent to the active surface 111 of the substrate 11. In this embodiment, the first integrated passive device (IPD) 15 is an inducer, however, the first integrated passive device (IPD) 15 may be a capacitor, a resistor, or a combination of a inducer, a capacitor and a resistor.

Figure 5:
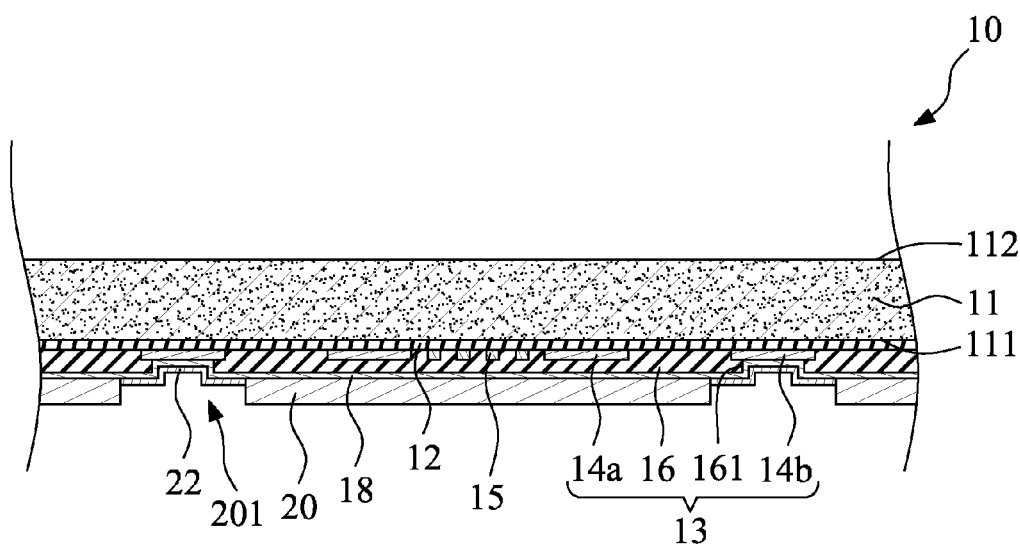

Referring to FIG. 5, a first seed layer 18 is formed on the first protection layer 16 and its openings 161. The first seed layer 18 contacts the second pads 14b in the openings 161. Then, a photoresist layer 20 is formed on the first seed layer 18, and has a plurality of openings 201 to expose a part of the first seed layer 18. The material of first seed layer 18 is tantalum nitride. Then, a first metal layer 22 is formed in the openings 201 of the photoresist layer 20. The first metal layer 22 is a single layer or multi-layer structure and the material of the first metal layer 22 is a mixture of nickel (Ni), palladium (Pd) and gold (Au); nickel (Ni) and gold (Au); or nickel (Ni) and palladium (Pd).

Figure 6:
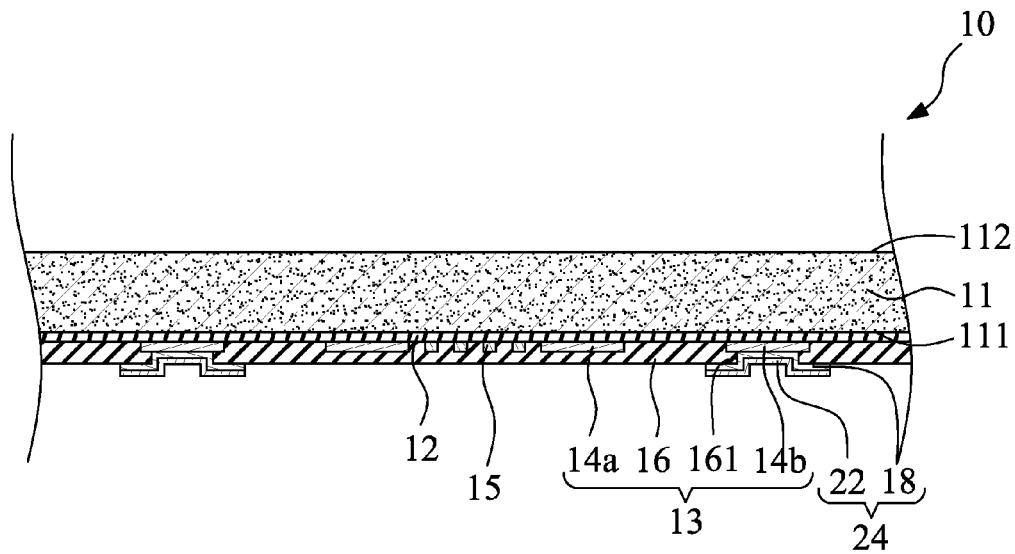

Referring to FIG. 6, the photoresist layer 20 is removed. Then, the first seed layer 18 that is not covered by the first metal layer 22 is removed so as to form a plurality of under bump metallurgies (UBM) 24.

Figure 7:
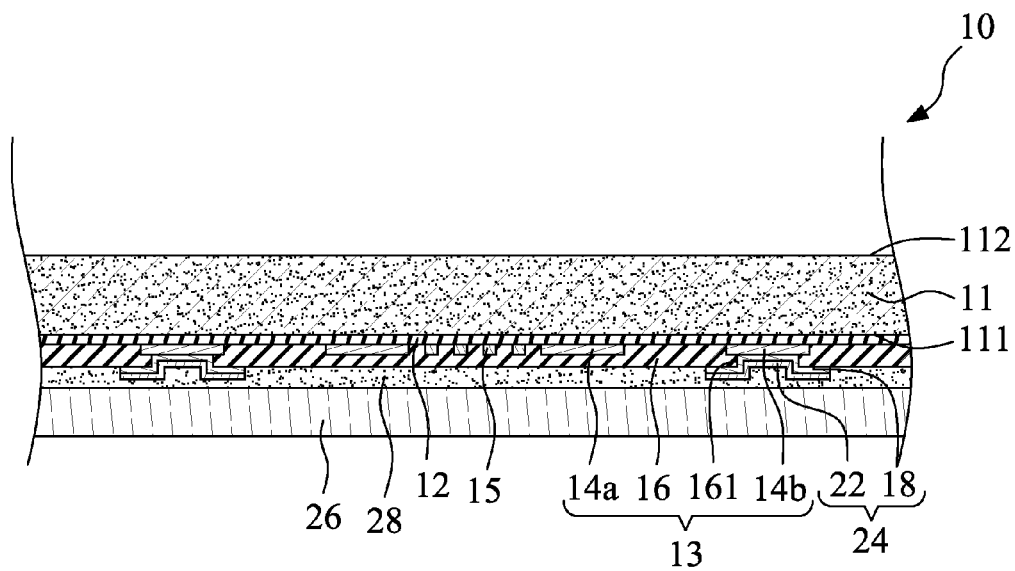

Referring to FIG. 7, the wafer 10 is attached to a carrier 26 by using an adhesive layer 28, wherein the under bump metallurgies (UBM) 24 face the carrier 26.

Figure 8:
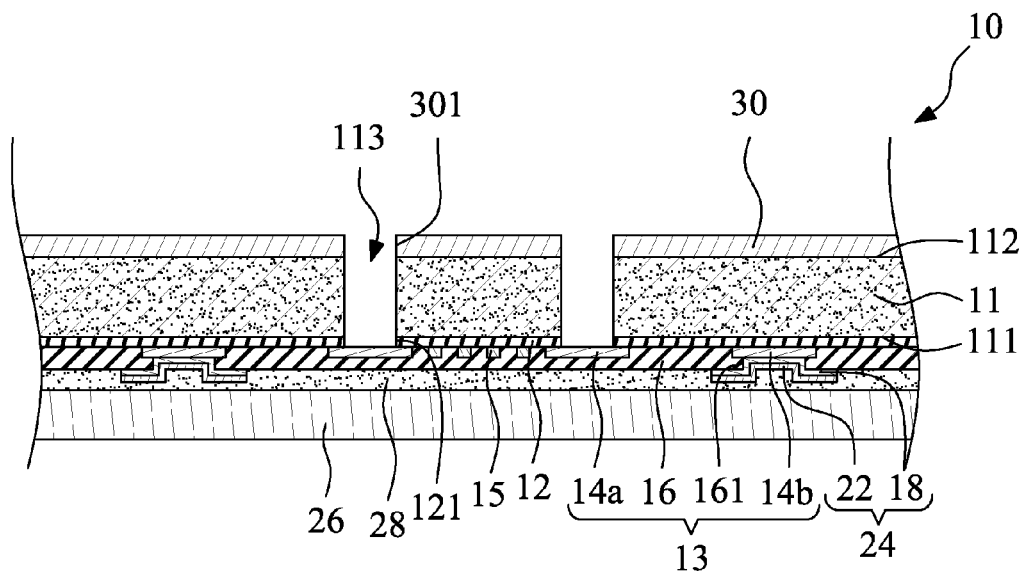

Referring to FIG. 8, a photoresist layer 30 is formed on the inactive surface 112 of the substrate 11, and has a plurality of openings 301 to expose a part of the inactive surface 112 by etching process, such as wet etching or dry etching. Then, a plurality of cylindrical cavities 113 are formed from the inactive surface 112 of the substrate 11 corresponding to the openings 301 of the photoresist layer 30. The cylindrical cavities 113 extend through the substrate 11 and the first dielectric layer 12, so that the first dielectric layer 12 has a plurality of openings 121. That is, each of the openings 121 is a part of each of the cylindrical cavities 113, and penetrates through the first dielectric layer 12. It is to be noted that the positions of the cylindrical cavities 113 must correspond to that of the first pads 14a, so that the first pads 14a are exposed by the cylindrical cavities 113.

Figure 9:
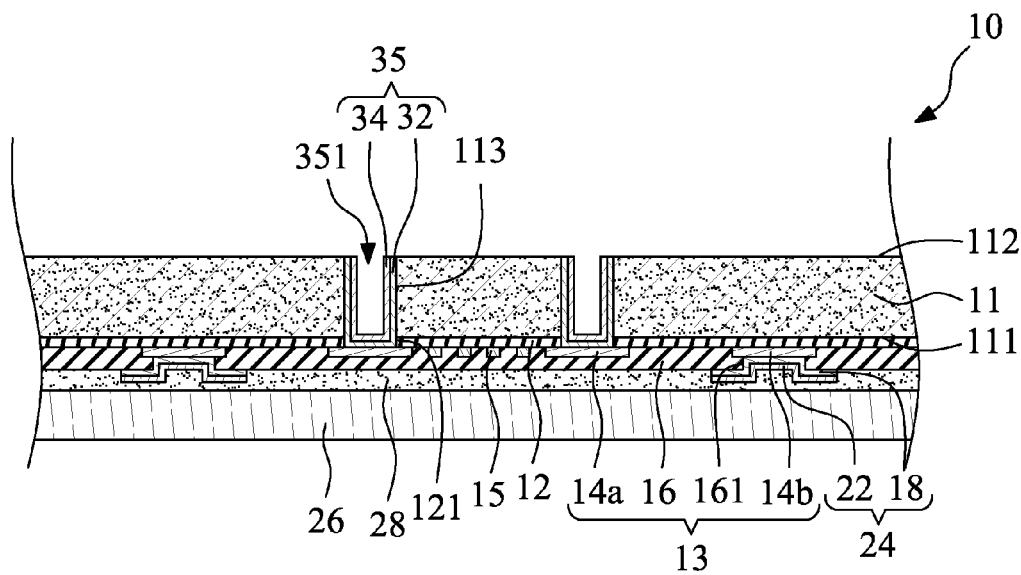

Referring to FIG. 9, a plurality of interconnection metals 35 are formed in the cylindrical cavities 113 to electrically connect the circuit layer 13. In this embodiment, a second seed layer 32 is formed in the cylindrical cavities 113 and contacts the first pads 14a. Then, a second metal layer 34 is formed on the second seed layer 32. The material of the second seed layer 32 is tantalum nitride or tantalum tungsten, and the material of the second metal layer 34 is copper. The second seed layer 32 and the second metal layer 34 forms the interconnection metal 35. However, the second seed layer 32 may be omitted, that is, the second metal layer 34 at this position is the interconnection metal 35. In this embodiment, the interconnection metal 35 defines an interior portion 351.

Figure 10:
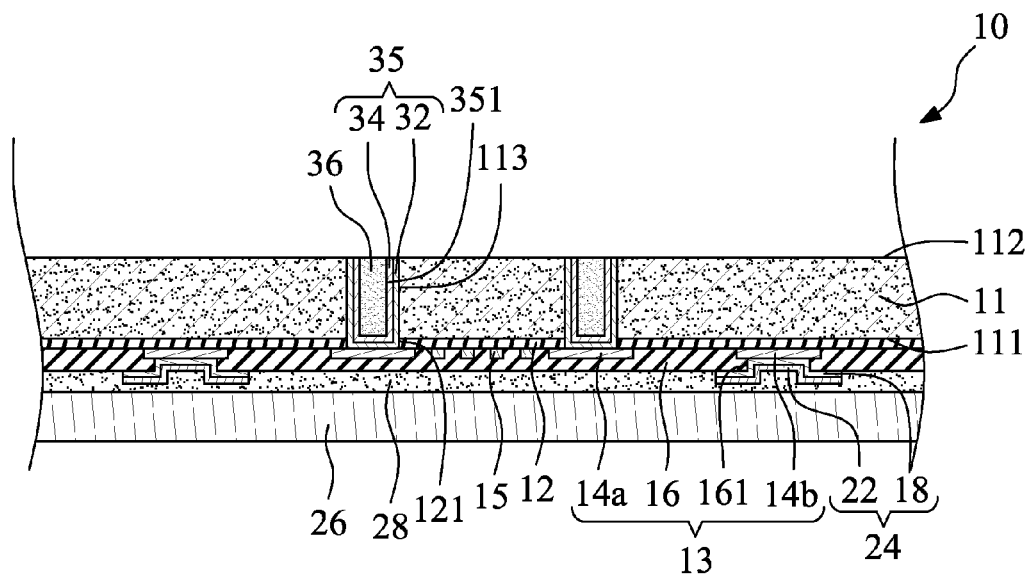

Referring to FIG. 10, a central insulation material 36 is filled in the interior portion 351. In other embodiments, the second metal layer 34 in FIG. 7 may fill up the cylindrical cavity 113, that is, the interconnection metal 35 may be a solid pillar, and the central insulation material 36 can be omitted.

Figure 11:
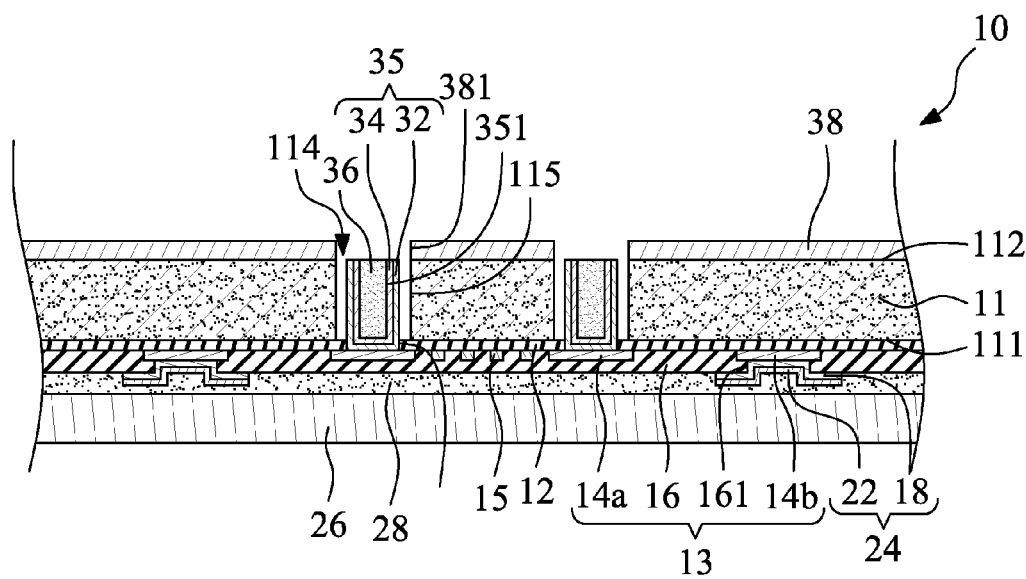

Referring to FIG. 11, a photoresist layer 38 is formed on the inactive surface 112 of the substrate 11, and has a plurality of openings 381 to expose the interconnection metals 35. Then, a plurality of circular grooves 114 are formed from the inactive surface 112 of the substrate 11 according to the openings 381, wherein the circular grooves 114 surround the interconnection metals 35. In this embodiment, the circular grooves 114 only extend through the substrate 11 to form a plurality of through holes 115.

Figure 12:
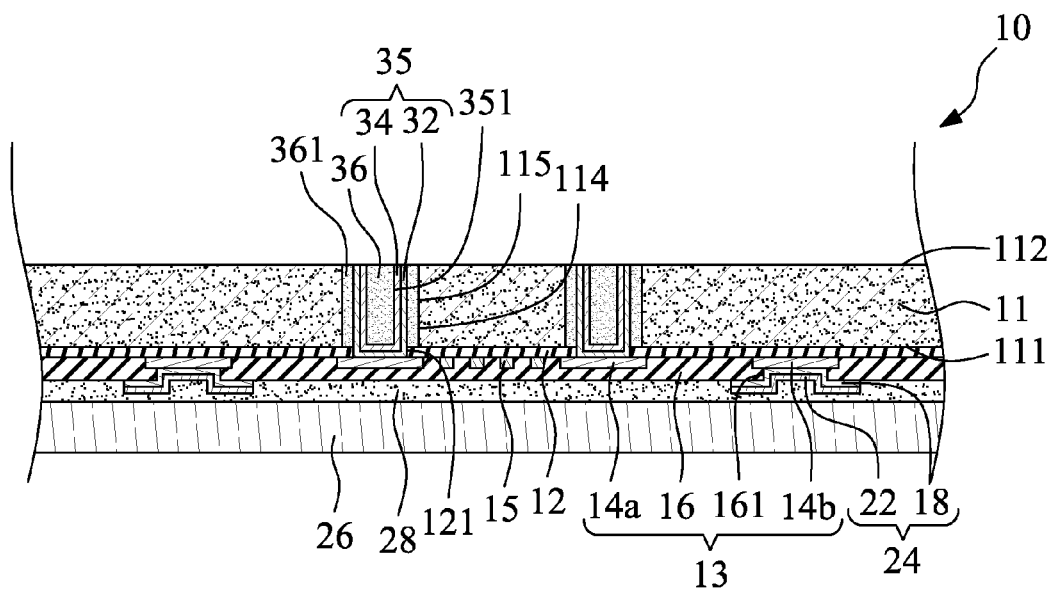

Referring to FIG. 12, an insulation circular layer 361 is formed in the circular grooves 114 to surround the interconnection metals 35. In this embodiment, the material of the central insulation material 36 is a polymer, which is the same as that of the insulation circular layer 361. In this embodiment, the insulation circular layer 361 does not extend into the first dielectric layer 12; therefore, the bottom surface of the interconnection metal 35 is not coplanar with the bottom surface of the insulation circular layer 361.

Figure 13:
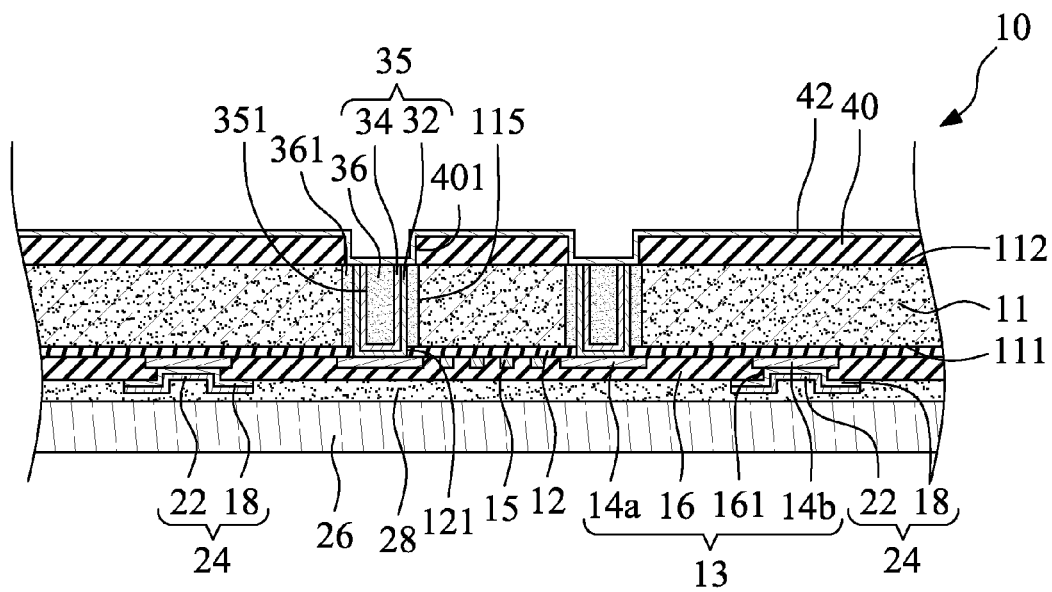

Referring to FIG. 13, a second dielectric layer 40 is formed on the inactive surface 112 of the substrate 11, and has a plurality of openings 401 to expose the interconnection metals 35. In this embodiment, the second dielectric layer 40 includes a polymer such as polyimide (PI) or polypropylene (PP). However, in other embodiments, the material of the second dielectric layer 40 can be silicon oxide or silicon nitride. Then, a third seed layer 42 is formed on the second dielectric layer 40 and its openings 401 to contact the interconnection metals 35 in the openings 401. The material of the third seed layer 42 is tantalum nitride or tantalum tungsten.

Figure 14:
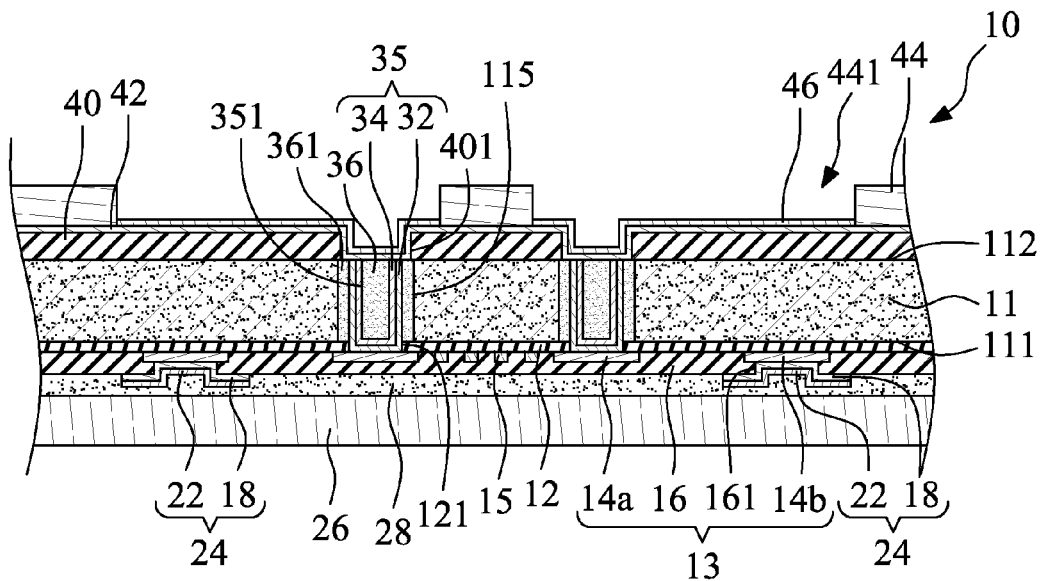

Referring to FIG. 14, a photoresist layer 44 is formed on the third seed layer 42, and has a plurality of openings 441 to expose a part of the third seed layer 42. Then, a third metal layer 46 is formed in the openings 441 of the photoresist layer 44. The material of the third metal layer 46 is copper.

Figure 15:
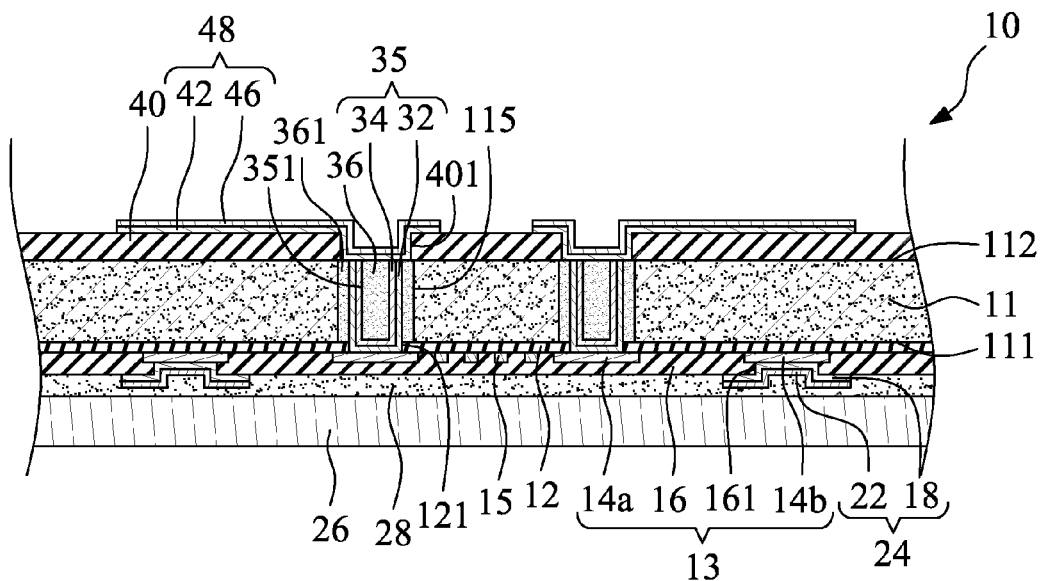

Referring to FIG. 15, the photoresist layer 44 is removed. Then, the third seed layer 42 that is not covered by the third metal layer 46 is removed so as to form a redistribution layer 48. However, the third seed layer 42 may be omitted, that is, third metal layer 46 at this position is the redistribution layer 48.

Figure 16:
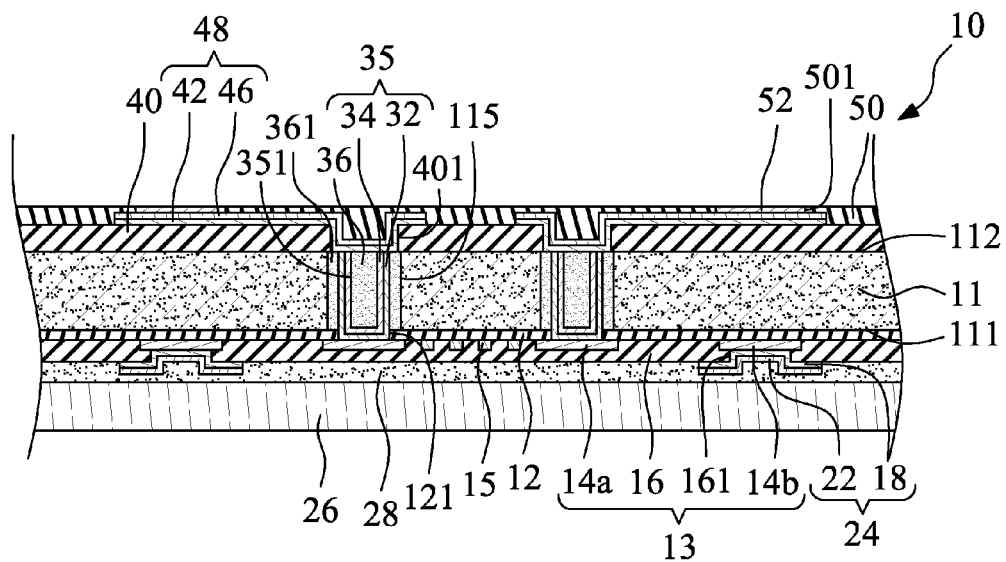

Referring to FIG. 16, a second protection layer 50 is formed on the second dielectric layer 40 and the redistribution layer 48, and has a plurality of openings 501 to expose a part of the redistribution layer 48. The material of the second protection layer 50 may be the same as that of the second dielectric layer 40. Then, a surface finish layer 52 is plated on the exposed part of the redistribution layer 48.

Figure 17:
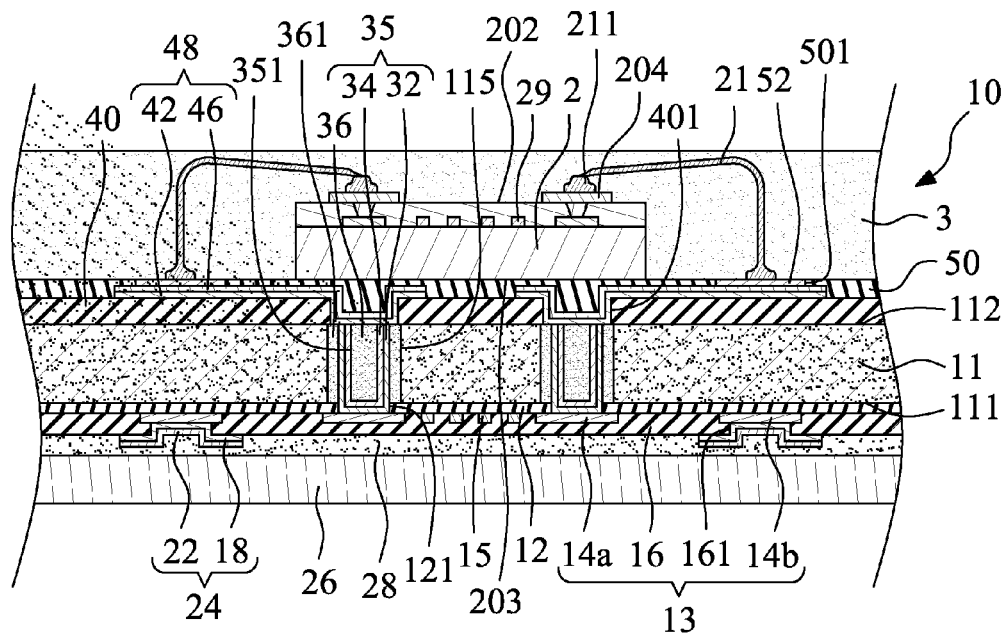

Referring to FIG. 17, a die 2 is attached adjacent to the inactive surface 112 of the substrate 11, and electrically connected to the under bump metallurgies (UBMs) 24. In this embodiment, the die 2 has an active surface 202, a inactive surface 203, a plurality of pads 204, and at least one second integrated passive device (IPD) 29. The pads 204 and the second integrated passive device (IPD) 29 are disposed adjacent to the active surface 202 of the die 2. In this embodiment, the second integrated passive device (IPD) 29 is an inducer, however, the second integrated passive device (IPD) 29 may be a capacitor, a resistor, or a combination of a inducer, a capacitor and a resistor. The inactive surface 203 of the die 2 is adhered on the second protection layer 50. The pads 204 are electrically connected to the surface finish layer 52 on the exposed part of the redistribution layer 48 through the bonding wires 21. That is, the bonding wires 21 connect the die 2 and the redistribution layer 48. In this embodiment, the bonding type of the bonding wires 21 is a reverse bond. The first step of the reverse bond is forming a wire ball 211 on the pad 204 of the die 2. Then, on the tip of the wire 21 another wire ball is formed and is bonded on the surface finish 52. Finally, the wire 21 is cut off after it is drawn to contact the wire ball 211.

In this embodiment, the die 2 and the bonding wires 21 are disposed adjacent to the inactive surface 112 of the substrate 11, thereby preventing the circuit layer 13 on the active surface 111 of the substrate 11 from being damaged during the wire bonding process and the die attaching process. As is well known, bonding wire is pressed to a bonding pad and ultrasonic friction applied to finish wire bonding. However, the thickness of the second pads 14b is less than that of the redistribution layer 48 or the surface finish layer 52, so that if the wire bonding process were to be performed on the second pads 14b of the active surface 111 of the substrate 11, the second pads 14b would be easily damaged. Next, the molding compound 3 is formed adjacent to the inactive surface 112 of the substrate 11 to encapsulate the die 2 and the bonding wires 21. In this embodiment, the molding compound 3 is disposed on the second protection layer 50.

Figure 18:
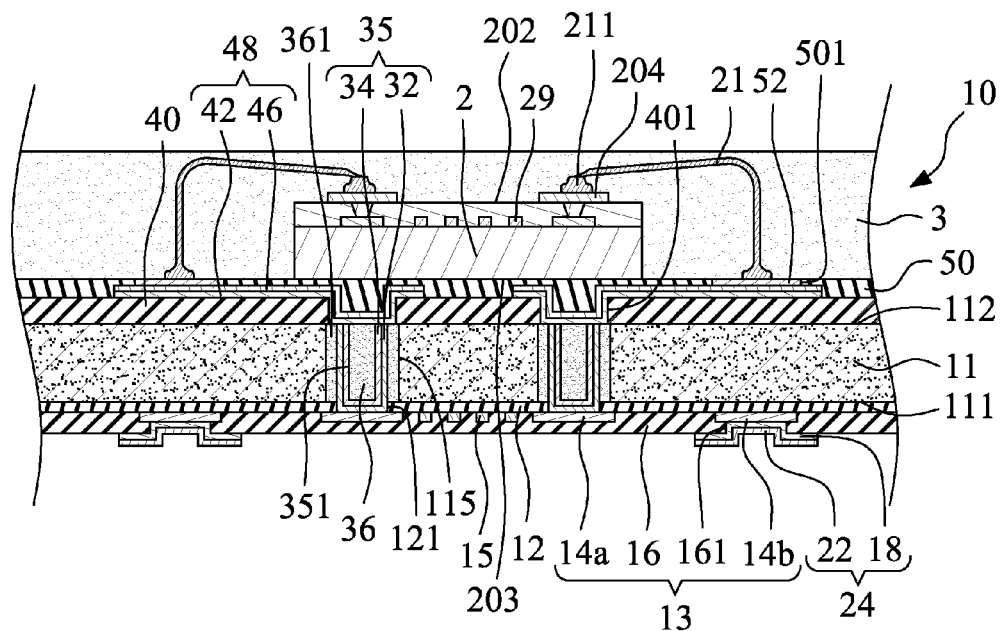

Referring to FIG. 18, the carrier 26 and the adhesive layer 28 are removed.

Figure 19:
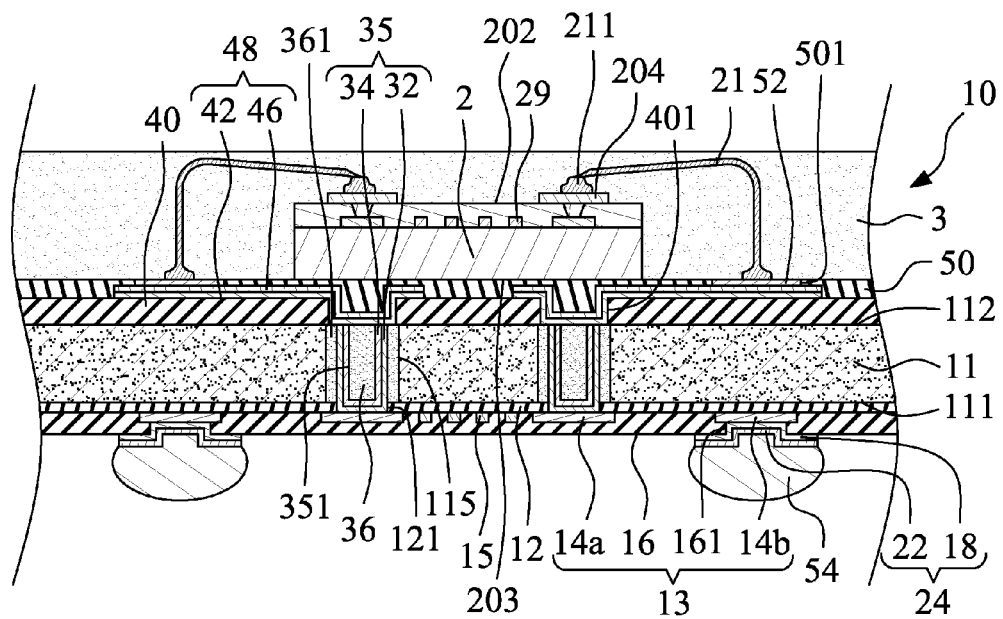

Referring to FIG. 19, a plurality of solder balls 54 are formed on the under bump metallurgies (UBM) 24. Then, the wafer 10 is cut to form the plurality of semiconductor devices 1, as shown in FIG. 1.

As is well known, bonding and de-bonding are high risk processes for a thin wafer. Therefore, if a thin wafer undergoes repeated bonding and de-bonding processes, the possibility of cracking or breaking is relative high. In this embodiment, only one carrier 26 is used in the process, and the wafer 10 is bonded to the carrier 26 and de-bonded from the carrier 26 only once so as to prevent the wafer 10 from cracking or breaking. That is, this embodiment has only one de-bonding step, and the molding compound 3 has already formed on the wafer 10 before the de-bonding step, thus, the wafer 10 is strengthened and not easily damaged during the de-bonding step. Thus, the yield is greatly raised. In addition, the semiconductor process of this embodiment is simplified, so that the manufacturing cost is reduced.

Referring to FIGS. 20 to 23, a semiconductor process for manufacturing a semiconductor device according to another embodiment of the present invention is illustrated. The initial steps of the semiconductor process of this embodiment are the same as the steps of FIGS. 1 to 7.

Figure 20:
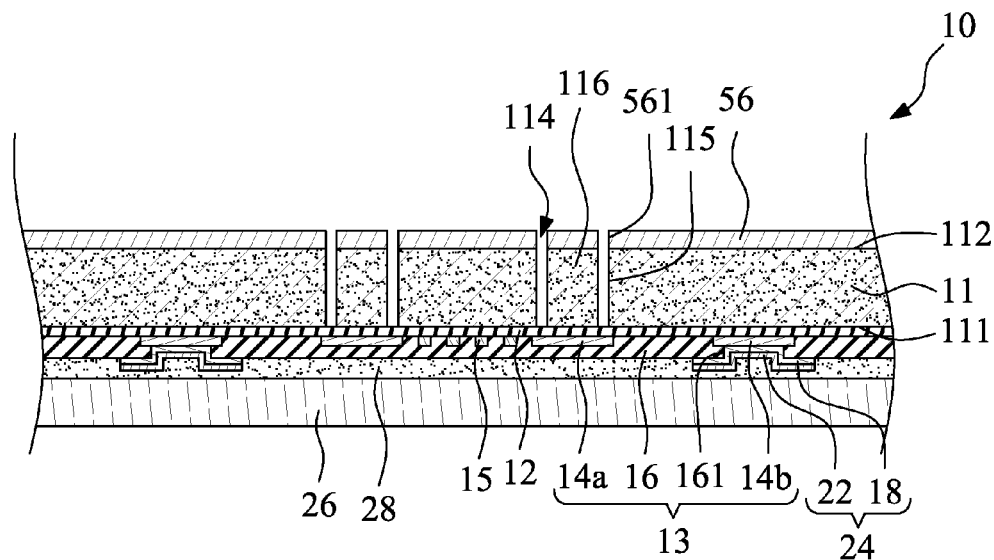
FIGS. 20 to 23 illustrate a semiconductor process for manufacturing a semiconductor device according to another embodiment of the present invention.

Referring to FIG. 20, a photoresist layer 56 is formed on the inactive surface 112 of the substrate 11, and has a plurality of ring openings 561 to expose the inactive surface 112 of the substrate 11 by etching process, such as wet-etching or dry-etching. Then, a plurality of circular grooves 114 are formed from the inactive surface 112 of the substrate 11 according to the ring openings 561, wherein each of the circular grooves 114 surrounds a central portion 116 which is a part of the substrate 11. In this embodiment, the circular grooves 114 only extend through the substrate 11 to form a plurality of through holes 115.

Figure 21:
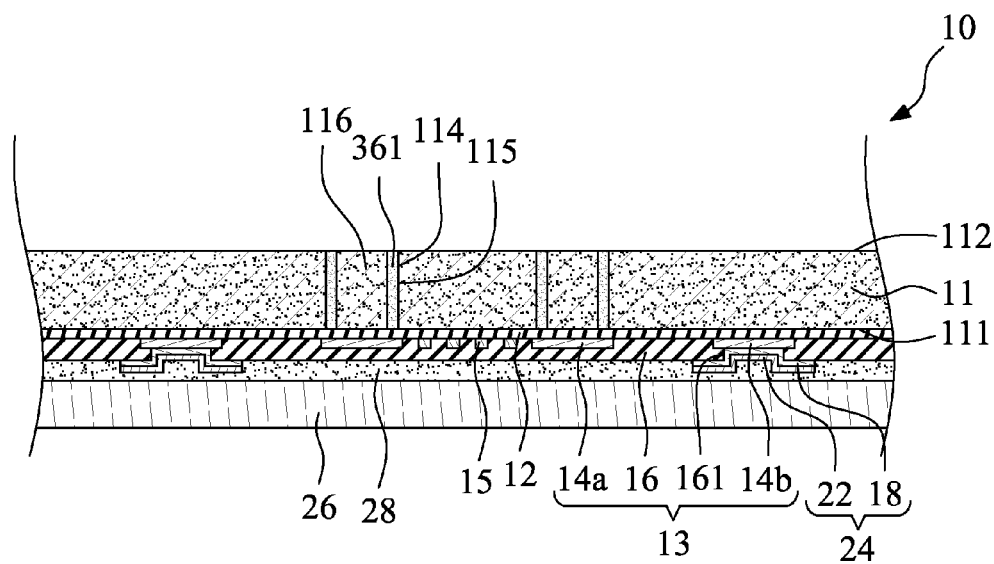

Referring to FIG. 21, an insulation circular layer 361 is formed in the circular grooves 114 to surround the central portion 116.

Figure 22:
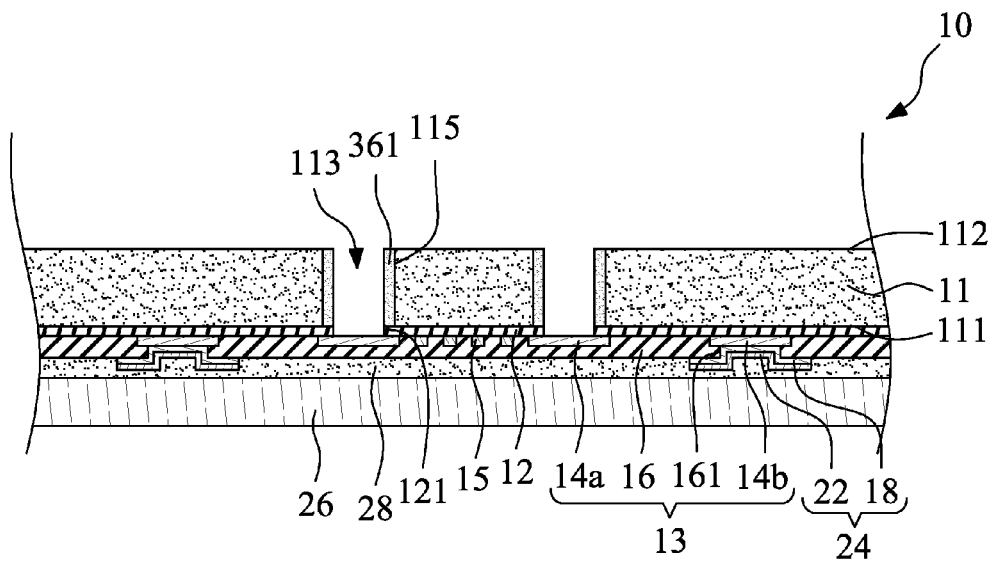

Referring to FIG. 22, the central portions 116 are removed to form a plurality of cylindrical cavities 113. The cylindrical cavities 113 extend through the substrate 11 and the first dielectric layer 12, so that the first dielectric layer 12 has a plurality of openings 121. That is, each of the openings 121 is a part of each of the cylindrical cavities 113, and penetrates through the first dielectric layer 12. It is to be noted that the positions of the cylindrical cavities 113 must correspond to that of the first pads 14a, so that the first pads 14a are exposed by the cylindrical cavities 113.

Figure 23:
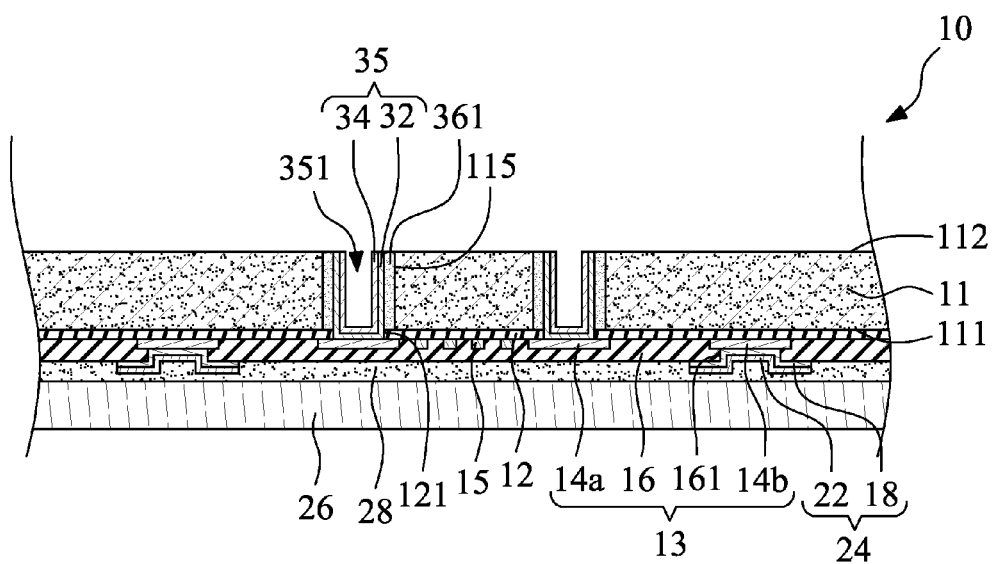

Referring to FIG. 23, a plurality of interconnection metals 35 are formed in the cylindrical cavities 113 to electrically connect the circuit layer 13. In this embodiment, a second seed layer 32 is formed in the cylindrical cavities 113 and contacts the first pads 14a. Then, a second metal layer 34 is formed on the second seed layer 32. The material of the second seed layer 32 is tantalum nitride or tantalum tungsten, and the material of the second metal layer 34 is copper. The second seed layer 32 and the second metal layer 34 forms the interconnection metal 35. However, the second seed layer 32 may be omitted, that is, the second metal layer 34 at this position is the interconnection metal 35. In this embodiment, the interconnection metal 35 defines an interior portion 351. Then, a central insulation material 36 is filled in the interior portion 351, as shown in FIG. 12. In other embodiments, the second metal layer 34 in FIG. 23 may fill up the cylindrical cavity 113, that is, the interconnection metal 35 may be a solid pillar, and the central insulation material 36 can be omitted. The subsequent steps of this embodiment are the same as the steps of FIGS. 12 to 19.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not be necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor device, comprising:
    a substrate;
    a conductive via formed in the substrate, the conductive via having a first end substantially coplanar with an inactive surface of the substrate;
    a circuit layer, disposed adjacent to an active surface of the substrate and electrically connected to a second end of the conductive via;
    a redistribution layer disposed adjacent to the inactive surface of the substrate, the redistribution layer having a first portion disposed on the first end and electrically connected thereto, and a second portion positioned upward and away from the first portion; and a die, disposed adjacent to the inactive surface of the substrate and electrically connected to the second portion of the redistribution layer.

2. The semiconductor device of claim 1, further comprising a dielectric layer disposed between the inactive surface of the substrate and the second portion of the redistribution layer.

3. The semiconductor device of claim 1, further comprising a protection layer covering the redistribution layer and the dielectric layer, the protection layer having openings to expose portions of the redistribution layer.

4. The semiconductor device of claim 3, wherein the openings facilitate the electrical connection between the die and the redistribution layer.

5. The semiconductor device of claim 1, further comprising a plurality of bonding wires electrically connecting the die and the redistribution layer.

6. The semiconductor device of claim 1, further comprising a plurality of under bump metallurgies (UBMs), disposed adjacent to the active surface of the substrate and electrically connected to the circuit layer.

7. The semiconductor device of claim 1, wherein the circuit layer and the die each further comprise at least one integrated passive device.

8. The semiconductor device of claim 1, wherein the conductive via comprises a first metal layer comprising an annular portion and a base portion contiguous thereto, the annular portion disposed vertically and the base portion adjacent and substantially parallel to the active surface.

9. The semiconductor device of claim 8, wherein the conductive via further comprises a second metal layer disposed on interior surfaces of the first metal.

10. A semiconductor device, comprising:
a substrate;
a conductive via formed in the substrate, a first end of the conductive via protruding from an inactive surface of the substrate;
a circuit layer, disposed adjacent to an active surface of the substrate and electrically connected to a second end of the conductive via;
a redistribution layer disposed adjacent to the inactive surface of the substrate, the redistribution layer having a first portion disposed on the first end and electrically connected thereto, and a second portion positioned upward and away from the first portion; and
a die, disposed adjacent to the inactive surface of the substrate and electrically connected to the second portion of the redistribution layer.

11. The semiconductor device of claim 10, further comprising a dielectric layer disposed between the inactive surface of the substrate and the second portion of the redistribution layer.

12. The semiconductor device of claim 11, wherein the redistribution layer is disposed around lateral surfaces of the first end of the conductive via.

13. The semiconductor device of claim 10, further comprising a protection layer covering the redistribution layer and the dielectric layer, the protection layer having openings to expose portions of the redistribution layer.

14. The semiconductor device of claim 10, wherein the conductive via comprises a first metal layer comprising an annular portion and a base portion contiguous thereto, the annular portion disposed vertically and the base portion adjacent and substantially parallel to the active surface.

15. The semiconductor device of claim 14, wherein the conductive via further comprises a second metal layer disposed on interior surfaces of the first metal.

16. The semiconductor device of claim 10, further comprising a plurality of under bump metallurgies (UBMs), disposed adjacent to the active surface of the substrate and electrically connected to the circuit layer.

* * * * *